(12) United States Patent
Verhagen

(10) Patent No.: US 7,378,669 B2
(45) Date of Patent: May 27, 2008

(54) LITHOGRAPHIC APPARATUS, DEVICE MANUFACTURING METHOD, AND DEVICE MANUFACTURED THEREBY

(75) Inventor: Martinus Cornelis Maria Verhagen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/902,259

(22) Filed: Jul. 30, 2004

(65) Prior Publication Data
US 2005/0035307 A1 Feb. 17, 2005

(30) Foreign Application Priority Data
Jul. 31, 2003 (EP) ................... 03077408

(51) Int. Cl.
*G01J 1/00* (2006.01)
*G02B 5/00* (2006.01)

(52) U.S. Cl. ................. 250/492.1; 250/503.1; 250/505.1

(58) Field of Classification Search ........... 355/30; 250/492.1, 503.1, 505.1
See application file for complete search history.

(56) References Cited

U.S. PATENT DOCUMENTS

| | | | |
|---|---|---|---|
| 6,222,610 B1 * | 4/2001 | Hagiwara et al. | 355/30 |
| 6,304,630 B1 * | 10/2001 | Bisschops et al. | 378/119 |
| 6,421,112 B1 * | 7/2002 | Bisschops et al. | 355/53 |
| 2001/0055101 A1 | 12/2001 | Hayashi | |
| 2001/0055326 A1 | 12/2001 | Miwa et al. | |
| 2002/0006675 A1 | 1/2002 | Shigaraki | |

FOREIGN PATENT DOCUMENTS

| | | |
|---|---|---|
| EP | 1 143 491 A1 | 10/2001 |
| EP | 1 229 573 A1 | 8/2002 |
| JP | 6-216000 | 8/1994 |
| JP | 09306825 | 11/1997 |
| JP | 2000-323396 | 11/2000 |
| JP | 2001-326162 | 11/2001 |
| JP | 2002-208313 | 7/2002 |
| JP | 2003-163159 | 6/2003 |
| JP | 2004-186179 | 7/2004 |
| WO | WO 01/81907 A1 | 11/2001 |
| WO | WO 03036695 | 5/2003 |

* cited by examiner

*Primary Examiner*—David Vanore
(74) *Attorney, Agent, or Firm*—Pillsbury Winthrop Shaw Pittman, LLP

(57) ABSTRACT

A lithographic projection apparatus includes a beam path for a beam of radiation, a projection system, a support structure for supporting a patterning device and a substrate holder for holding a substrate. The beam path includes a radiation system for providing the beam of radiation, and the projection system projects the beam of radiation patterned by the patterning device onto a target portion on the substrate. At least one chamber that includes at least part of the beam path. A purge gas supply subsystem is coupled to the chamber for supplying a flow of purge gas to the chamber, and a control unit is arranged to switch the purge gas supply subsystem between at least two different modes of operation. The control unit controls the purge gas supply subsystem to supply mutually different respective non-zero flow rates of the purge gas to the chamber in the different modes of operation.

17 Claims, 3 Drawing Sheets

LITHOGRAPHIC APPARATUS, DEVICE MANUFACTURING METHOD, AND DEVICE MANUFACTURED THEREBY

CROSS-REFERENCE TO RELATED APPLICATIONS

This application claims the benefit of priority from European Patent Application No. 03077408.7, filed Jul. 31, 2003, the content of which is incorporated herein by reference in its entirety.

FIELD

The present invention relates to a lithographic projection apparatus, a device manufacturing method, and a device manufactured thereby.

BACKGROUND

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using a suitable electronic device. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

The beam path is sensitive to the presence of substances such as water, oxygen and carbohydrates. In gaseous or vapor form, theses substances absorb radiation from the beam, in particular, when a UV beam is used. In addition, decomposition products of these substances, which can be formed under the influence of irradiation by the beam, can cause damage to the optical elements in the beam path, which negatively affects patterning of the substrate.

To prevent the effects of such substances it is known to inject a flow of inert purge gas (such as nitrogen gas) into the chambers that house the beam path. The continuous supply of purge gas drives out unwanted gases from the beam path. Condensed material is also purged, when it evaporates or sublimates when the substances have been driven from the atmosphere of the beam path. Of course, the evaporation or sublimation generally takes more time than the driving out of gaseous substances, but ultimately all forms of unwanted substances are driven from the beam path.

The lithographic projection apparatus includes a conditioning unit for the supply of purge gas. The conditioning unit purifies the purge gas and stabilizes its temperature before supplying the purge gas to the chamber that contains the beam path. When the apparatus is switched on, the supply of purge gas starts. After a time sufficient to evaporate or sublimate and drive out all unwanted substances, operation of the apparatus can be used safely to project the patterned beam onto substrates. The apparatus processes successive substrates while it maintains a continuous flow of purge gas.

When the apparatus has to go down for maintenance that involves opening the chamber, the supply of purge gas is switched off. This is done for safety reasons because the purge gas, even if not poisonous in itself, can form a health hazard when it drives out oxygen from the room where the apparatus is located. Switching the purge gas off also prevents a waste of purge gas. After maintenance, the apparatus has to start up again and the unwanted substances have to be driven out. The time needed to drive out the substances extends the down-time due to maintenance. This reduces the economic return on the projection apparatus. Similarly, down-time due to power failures that cause the conditioning unit to stop operating includes the time needed to start up the apparatus.

SUMMARY

Among others, it is an aspect of the invention to reduce the down-time of a lithographic projection apparatus.

In a lithographic projection apparatus, the beam path should be free of gaseous material and condensed material that absorb the beam, or it could damage the optical components under influence of the beam. To remove this type of material, a purge gas is supplied to a chamber that contains at least part of the beam path. The purge gas is supplied at a normal flow rate to purge an unwanted substance from an atmosphere in the beam path while the beam is passed through the beam path. The flow rate is switched back from the normal flow rate to a lower flow rate when the chamber has to be opened for access. The lower flow rate is so high that condensation of the unwanted substance onto an optical element in the beam path is substantially prevented by the flow of purge gas at the further flow rate, but not generally so high as would be necessary to prevent significant absorption from the beam.

In an embodiment, a lithographic projection apparatus is provided. The apparatus includes a beam path for a beam of radiation. The beam path includes a radiation system for providing the beam of radiation. The apparatus also includes a projection system, a support structure for supporting a patterning device, and a substrate holder for holding a substrate. The projection system projects the beam of radiation patterned by the patterning device onto a target portion on the substrate. The apparatus also includes at least one chamber that includes at least part of the beam path and in which at least part of the radiation system, the projection system, support structure and/or the substrate holder, or combinations thereof, is exposed to an atmosphere in the chamber. A purge gas supply subsystem is coupled to the chamber for supplying a flow of purge gas to the chamber, and a control unit is arranged to switch the purge gas supply subsystem between at least two modes of operation. The control unit control the purge gas supply subsystem to supply mutually different respective non-zero flow rates of the purge gas to the chamber in the respective modes of operation.

In an embodiment, a lithographic projection apparatus is provided. The apparatus includes a radiation system for providing a beam of radiation, and a support structure for supporting a patterning device. The patterning device serves to pattern the beam of radiation according to a desired pattern. The apparatus also includes a substrate holder for holding a substrate, a projection system for projecting the patterned beam of radiation on a target portion of the substrate, and a chamber that is capable of carrying a purge gas and through which the beam of radiation travels. The apparatus also includes a purge gas supply system coupled to the chamber for supplying a flow of the purge gas to the chamber. At least one of the radiation system, support structure, substrate holder, and projection system is at least partially exposed to the purge gas in the chamber. A control unit is arranged to switch the purge gas supply system between at least two different modes of operation. The control unit controls the purge gas supply system to supply mutually different respective flow rates of the purge gas to the chamber in the different modes of operation.

According to the invention, the apparatus is switchable to different modes and measures are taken to realize different purge gas flow rates in the different modes. In one embodiment, the apparatus has a normal mode and a further mode. In the normal mode, an operable beam of radiation can be supplied through the beam path and the purge gas is supplied at a normal flow rate sufficient to keep out unwanted substances from the atmosphere in the chamber that would affect the beam.

In the further mode, operation of the beam is disabled and the purge gas is supplied at a lower flow rate, which may be insufficient to keep out unwanted substances from the atmosphere, but is generally sufficient to substantially prevent condensation of unwanted substances onto the optical system. In an embodiment, the further mode is a maintenance mode in which the chamber may be opened for access. Thus, the down-time after maintenance is reduced because no, or less, condensed matter needs to be expelled, with a reduced health risk because less purge gas is supplied. Preferably, the control unit blocks opening of the chamber in the normal mode.

In an embodiment, the modes include a pre-normal mode wherein the control unit controls the purge gas supply subsystem to supply purge gas at the normal flow rate, while disabling operation of the radiation system, the control unit switching from the further mode to the normal mode via the pre-normal mode. Thus, it is ensured that the atmosphere in the chamber will not optically affect the beam in the normal mode.

In an embodiment, the purge gas supply subsystem includes a sensor for detecting concentration of an unwanted substance in gas flowing out of the chamber, the control unit being coupled to receive a sensor signal from the sensor to defer switching from the pre-normal mode to the normal mode until the sensor signal indicates that the concentration has dropped below a predetermined level.

The subsystem may be switched to the normal mode after a predetermined time interval that is known to be sufficient to purge unwanted substance from the atmosphere, but because a margin is needed, this will generally increase the down time.

The flow rate of the purge gas may be reduced only to selected chambers that will be opened, leaving chambers that enclose other parts of the beam path closed and receiving purge gas at the normal flow rate. This may reduce down time for purging the other chambers.

The modes may include a start-up mode, wherein the control unit controls the purge gas supply unit to supply purge gas at a start up flow rate higher than the normal flow rate and the control unit disables operation of the radiation system. The increased start up flow rate reduces the time before the apparatus can be operated after start up. Preferably the start up flow rate is so high that turbulence occurs in the chamber (which is optically undesirable in the normal mode), so that evaporation or sublimation of unwanted material is speeded up.

In an embodiment, the purge gas supply subsystem includes an emergency bypass, coupled between a purge gas supply connection and that at least one of the chambers, with an emergency valve in the emergency bypass, arranged to supply purge gas to the chamber in the case of a failure of a normal purge gas supply. Thus, the down time after emergency stops, e.g. due to power failures, may be reduced by maintaining some flow of purge gas.

In an embodiment, a lithographic projection apparatus is provided. The apparatus includes a radiation system for providing a beam of radiation, and a support structure for supporting a patterning device. The patterning device serves to pattern the beam of radiation according to a desired pattern. The apparatus also includes a substrate holder for holding a substrate, a projection system for projecting the patterned beam of radiation on a target portion of the substrate, and a chamber that is capable of carrying a purge gas and through which the beam of radiation travels. The apparatus also includes a purge gas supply subsystem coupled to the chamber for supplying a flow of the purge gas to the chamber. At least one of the radiation system, support structure, substrate holder, and projection system is at least partially exposed to the purge gas in the chamber. The purge gas supply subsystem includes an emergency bypass, coupled between a purge gas supply connection and the chamber, with an emergency valve in the emergency bypass arranged to supply the purge gas to the chamber in case of a failure of a normal purge gas supply.

BRIEF SUMMARY OF THE DRAWINGS

Embodiments of the invention will now be described, by way of example only, with reference to the accompanying schematic drawings, in which corresponding reference symbols indicate corresponding parts, and in which.

DETAILED DESCRIPTION

Figure 1:
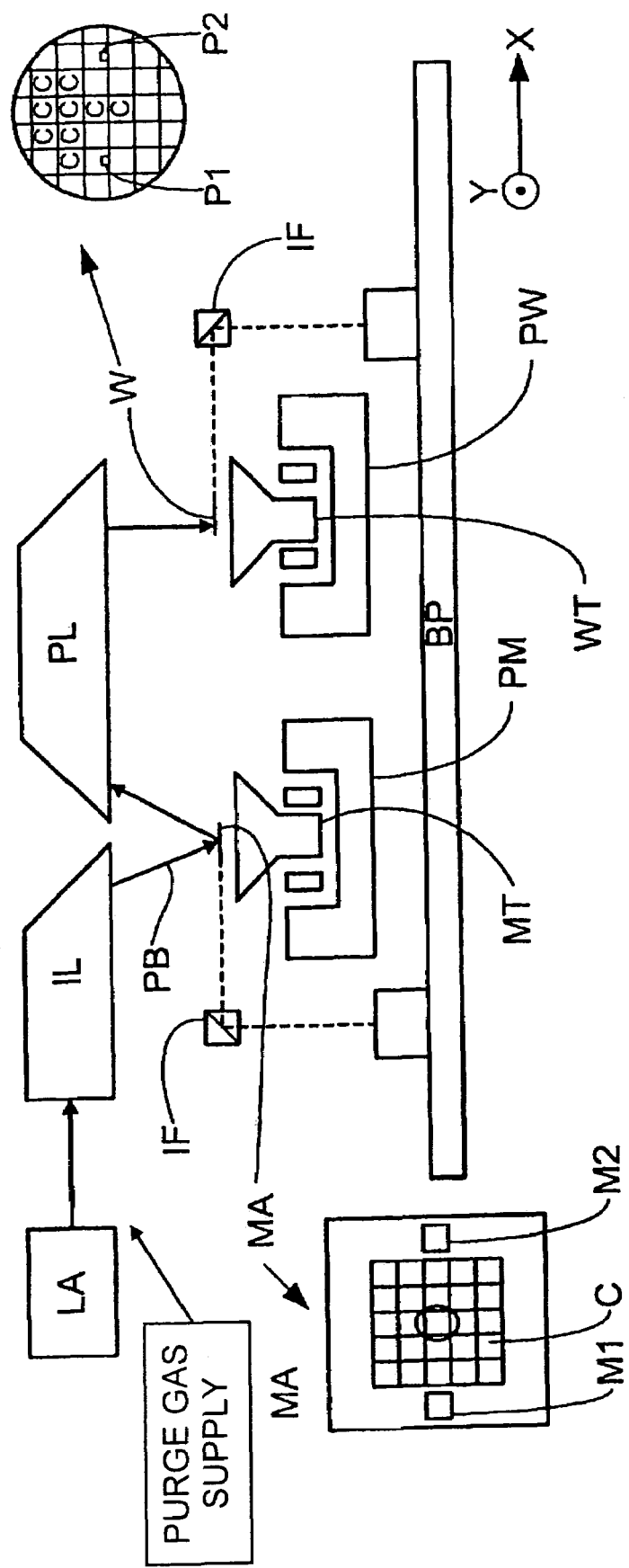
FIG. 1 depicts a lithographic projection apparatus according to an embodiment of the invention.

FIG. 1 schematically depicts a lithographic projection apparatus 1 according to an embodiment of the invention. The apparatus 1 includes a radiation system LA, IL, for supplying a projection beam PB of radiation (e.g. light in the deep ultraviolet region). In this particular case, the radiation system also includes a radiation source LA. A first object table (mask table) MT is provided with a mask holder for holding a mask MA (e.g. a reticle), and is connected to a first positioner PM for accurately positioning the mask with respect to item PL. A second object table (substrate table) WT is provided with a substrate holder for holding a substrate W (e.g. a resist-coated silicon wafer), and is connected to a second positioner PW for accurately positioning the substrate with respect to item PL. The apparatus 1 also includes a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. an excimer laser source) produces a beam of radiation. This beam is fed into an illumination system (illuminator) IL, either directly or after having traversed a conditioning device, such as a beam expander, for example. The illuminator IL may include an adjusting device for setting the outer and/or inner radial extent (commonly referred to as σ-outer and σ-inner, respectively) of the intensity distribution in the beam. In addition, it will generally include various other components, such as an integrator and a condenser (not shown). In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioner PW (and an interferometric measuring device IF), the substrate table WT can be moved accurately, e.g. so as to position different target portions C in the path of the beam PB. Similarly, the first positioner PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus), the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
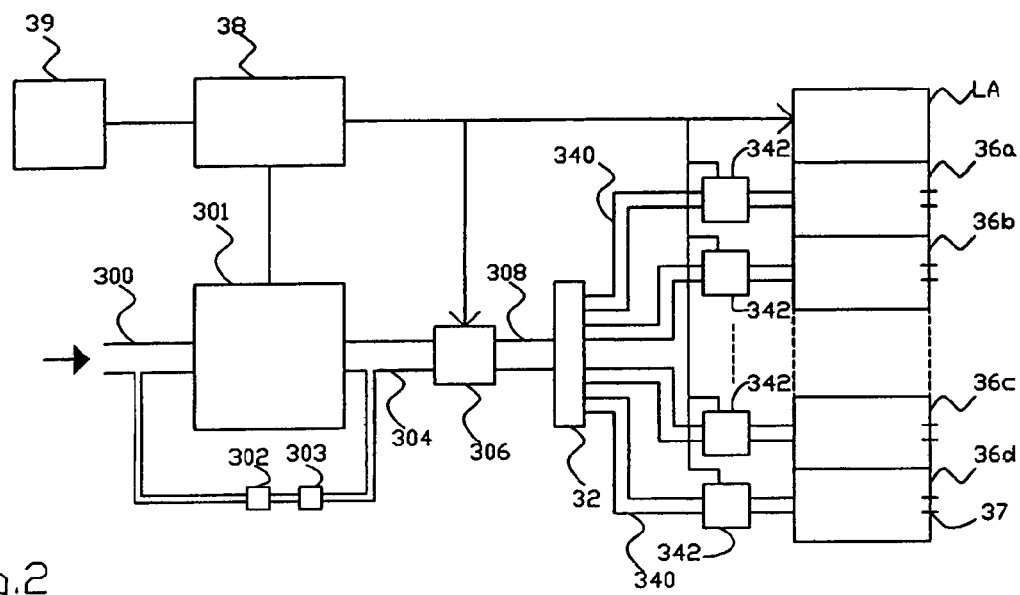
FIG. 2 shows an embodiment of a purge gas subsystem of the apparatus of FIG. 1.

FIG. 2 shows a purge gas supply subsystem of the lithographic projection apparatus. The figure schematically shows a radiation source LA and a series of different chambers 36a-d that house different parts of the beam path, and generally also the optical components for forming the beam (not shown for the sake of clarity). By way of example, four chambers are shown, but it should be appreciated that this is merely an example: in practice, fewer or more chambers may be provided. Typically, a first few chambers could contain the illumination system for forming a homogeneous beam, a next chamber could contain a reticle stage, a subsequent chamber could contain the projection lens and a final chamber could contain the wafer stage.

The subsystem includes a purge gas input 300, a conditioning unit 301, a reduction valve unit 306, a manifold 32 and chamber supply valve units 342. The purge gas input 300 is typically connected to some in-plant gas supply network (not shown). The purge gas input 300 is coupled to the input of the conditioning unit 301, which has an output coupled to an input of the reduction valve unit 306 via a pipe 304. The output of the reduction valve unit 306 is coupled to an input of the manifold 32 via a pipe 308. Outputs of the manifold 32 are coupled to the respective chambers 36a-d, each via a pipe 340 and a chamber supply valve unit 342. The chambers 36a-d have outlets 37 (only one indicated explicitly).

A bypass is provided that bridges the input 300 and the output (pipe) 304 of the conditioning unit 301. In the bypass, a flow regulator 302 and a valve 303 are provided in series.

The subsystem further includes a command input device 39 (typically a keyboard or a mouse) coupled to a control unit 38. The control unit 38 has outputs coupled to the conditioning unit 301, the radiation source LA, the chamber supply valve units 342 and the reduction valve unit 306.

In operation, the conditioning unit 301 receives an inert purge gas, such as Nitrogen, Helium, Argon etc. from the input 300. The conditioning unit 301 performs various conditioning processes, such as removal of contamination and thermal stabilization of the purge gas. Details of these processes are not relevant to the present invention. The processed purge gas is supplied to the reduction valve unit 306, which in turn supplies the purge gas to the manifold 32, which distributes the flow of purge gas to the various chambers 36a-d. The control unit 38 controls the operation of the subsystem.

Figure 3:
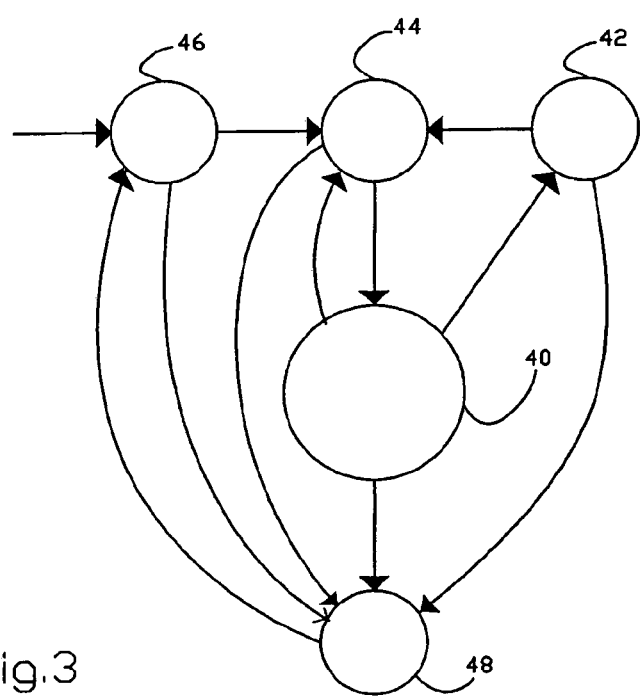
FIG. 3 shows a state diagram of the purge gas subsystem of FIG. 2.

FIG. 3 shows a state diagram that illustrates the operation of the control unit 38. The most relevant state is a normal state 40 in which the apparatus is fully operational, and can be switched to project a pattern onto a substrate with radiation supplied by radiation source LA and passed through the beam path in chambers 36a-d. The further states shown in FIG. 3 are a maintenance state 42, a pre-normal state 44, a startup state 46 and an off state 48.

In the normal state 40, the subsystem supplies purge gas to the chambers 36a-d at a flow rate that prevents gas concentrations of the unwanted substances in the beam path that would significantly affect beam propagation through the beam path (a fortiori this also prevents condensation of unwanted substances onto the optical components in the beam path). In the normal state 40, the conditioning unit 301 is operational, supplying a purge gas flow of, for example, 50 cubic meters at a pressure of 3.5 bar to the manifold 32. In this normal state 40, the chamber supply valve units 342 each pass a part of this flow (typically of the order of 10 cubic meters per hour) to its corresponding chamber 36a-d, from where the purge gas flow exits through the outlet 37. Thus, a steady flow of purge gas is maintained through each chamber 36a-d. It will be appreciated that different flow rates can be used without deviating from the invention, as long as the flow rate prevents gas concentrations of the unwanted substances in the beam path that would significantly affect beam propagation through the beam path.

The control unit 38 switches to the maintenance state 42 when the operator indicates on the input device 39 that a maintenance operation has to be executed that requires opening one or more of chambers 36a-d for external access. The control unit 38 may also switch to the maintenance state 42 under other conditions, for example, when some sensors do not indicate safe operating conditions. Preferably, the operator also indicates on the input device 39 which of the chambers 36a-d will be opened. In the maintenance state 42, the control unit 38 causes the chamber supply valve units 342 to reduce the flow rate to at least those of the chambers that will opened (or in those where unsafe operating conditions may exist).

Figure 4:
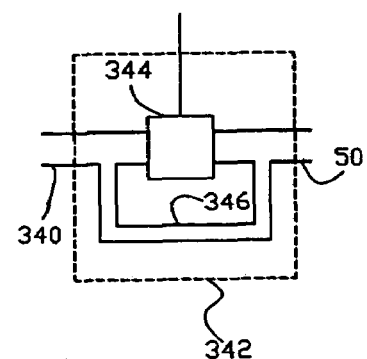
FIG. 4 shows a chamber supply valve unit of the purge gas subsystem of FIG. 2.

FIG. 4 shows an embodiment of a chamber supply valve unit 342. The chamber supply valve unit 342 has an input connected to a pipe 340 the is connected to the manifold 32 (not shown in FIG. 4), an output 50 coupled to a chamber (not shown) and a controllable valve 344 coupled between the input and the output. The valve 344 is bypassed by a narrow pipe 346. In operation, in the normal state 40, the control unit 38 causes the valve 344 to remain open, thereby allowing a flow of purge gas through the valve 344. In the maintenance state 42, the control unit 38 causes the valve 344 to close, thereby blocking the flow of purge gas through the valve 344, so that only a flow through the narrow pipe 346 remains. Thus, the flow rate into the chamber (not shown) is reduced. It should be realized that other embodiments are possible. For example, the bypass could be placed to inject gas at a different location into the chamber than the normal flow via the valve 344, such as more directed at the optical components for example. As another example, a valve with a controllable variable opening may be used, making a bypass unnecessary.

The flow rate is reduced to a level that reduces the concentration of unwanted substances in the atmosphere surrounding optical components in the beam path, thereby substantially preventing the unwanted substances to condense into liquid or solid form onto the optical components in the beam path or any hardware in the proximity of the beam path. However, the flow rate needs not be so high that gas concentrations of the unwanted components are prevented that would significantly affect beam propagation. In this respect the flow rate is lower than that in the normal state 40. Typically, the flow rate is reduced by a factor of about five. However, it will be appreciated that this factor is an example only, for example, a reduction with factor in a range of 2-10, or an even wider could be used.

By reducing the flow rate in the chambers that will be opened the health risks from the purge gas are reduced. Preferably, the control unit 38 only reduces the flow-rate in the chambers that will be opened according to the operator, leaving the flow rate in the other chambers the same as in the normal state 40. In the maintenance state 42, the control unit 38 disables operation of the radiation source LA (directly or indirectly by disabling all projection activity), so that projection of patterns onto substrates becomes impossible during the time that the flow rate is reduced.

Once maintenance has been completed, the operator indicates that the chambers have been closed and normal operation may be resumed. In response, the control unit 38 switches to the pre-normal state 44. In the pre-normal state 44, the control unit 38 restores the flow rate to all of the chambers to the level used in the normal state 40. The control unit 38 still disables operation of the radiation source LA in the pre-normal state 44. After a waiting time in the pre-normal state 44, the control unit 38 switches back to normal state 40, thereby enabling resumption of substrate processing, including activating radiation source LA.

The waiting time before switching to the normal state 40 may be realized in any one of a number of ways. In one embodiment, the control unit 38 uses a timer, and switches to the normal state 40 after a predetermined time interval after entering the pre-normal state 44.

Figure 5:
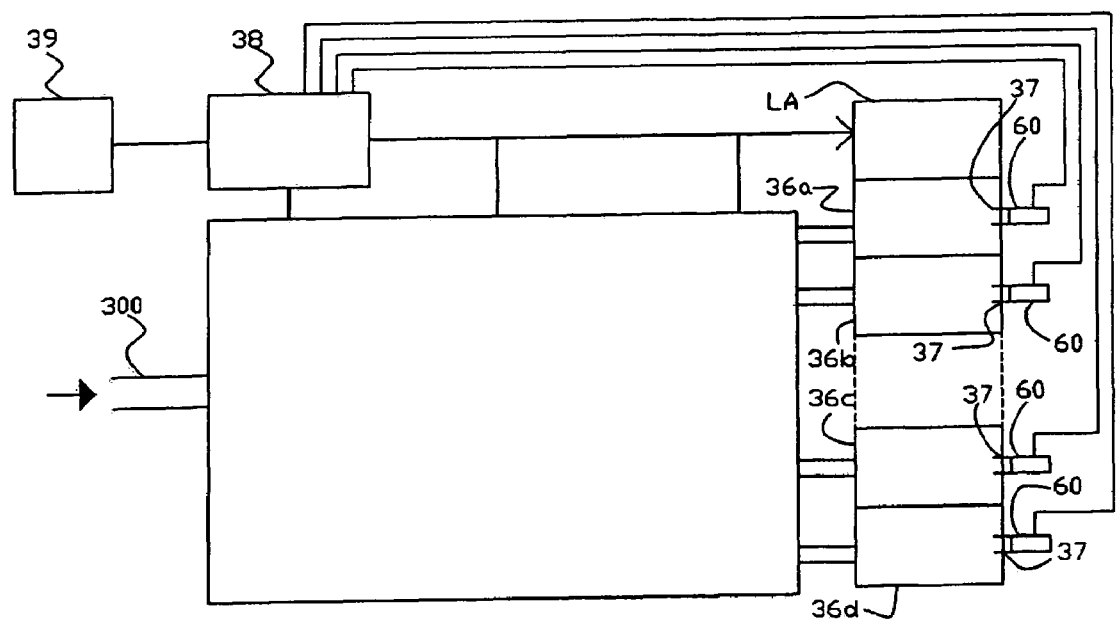
FIG. 5 shows another embodiment of a purge gas subsystem of the apparatus of FIG. 1.

FIG. 5 shows a further embodiment, in which sensors 60 are provided at the outlets 37 of the chambers 36a-d, for sensing a concentration of the unwanted substances in the outflow from the chambers. The control unit 38 receives signals from the sensors 60 and switches from the pre-normal state 44 to the normal state 40 only when the sensors 60 at all of the outlets 37 indicate that concentrations of unwanted substances below predetermined thresholds that indicate the possibility of safe operation. The sensors 60 may include, for example, a humidity sensor, an oxygen sensor and a total organic content sensor (known per se) at one or more of the outlets 37. Other possible sensors include a sulphur sensor, a silicon sensor or a sensor for phosphorous containing substances. Sensors for any other relevant substances may be added.

In an embodiment, a common set of sensors may be provided at a position where gas flow from all of the chambers 36a-d converges. In an embodiment, only the outlets 37 of a subset of the chamber 36a-d may have sensors, and the control unit 38 switches back to normal state 40 after at least a predetermined time interval in the pre-normal state 44, if other chambers 36a-d have been opened.

As an alternative, the sensors 60 may be provided elsewhere in the chambers 36a-d, instead of or in addition to the sensors at the outlets 37. If all of the sensors for a chamber indicate a sufficiently low level of unwanted substances, the mode switch is effected. Placing the sensors 60 at the outlet has the advantage that it provides a sensor location where it is ensured that all substances that are purged are also detected.

The "off" state 48 corresponds to a power down state, when at least the conditioning unit 301 has stopped operating. In the power down state 48, the control unit 38 (if still operating) disables operation of the radiation source LA and generates an alarm to the operator of the apparatus. In this case, the operator may open the valve 303, which is a manually operated valve, to allow unconditioned purge gas to flow to the chambers 36a-d. In this case, the passive regulator 302, which is, for example, a sonic regulator (a wall in the bypass with a small hole in it), regulates the flow. It should be realized that other ways of supplying unconditioned purge gas are possible, injecting the purge gas somewhere else in a channel to the chambers, for example.

During normal operation, the valve 303 should be closed, to block flow of unconditioned purge gas. Preferably, the control unit 38 has a detection input coupled to the valve 303, to detect whether the valve 303 is open. If so, the control unit 38 indicates to the operator that the valve 303 should be closed before operation can start, and remains in the off state 48 (and if necessary switches to the off-state) until the valve 303 is closed.

When the apparatus is started up, the control unit 38 assumes the start-up state 46 first. In the start-up state 46, the control unit 38 causes the reduction valve unit 306 to induce an increased flow rate of purge gas, higher than the flow rate in the normal state 40, to the chambers 36a-d. The flow rate in the normal state 40 is generally so low that it causes no significant turbulence in the beam path. In start up state 46, the flow rate of purge gas is preferably raised to a level that causes turbulence. The higher flow rate, and preferably the turbulence, causes unwanted substance to evaporate or sublimate from the optical components in the beam path at a higher rate. The control unit 38 disables operation of the radiation source LA in the start-up state 46.

Figure 6:
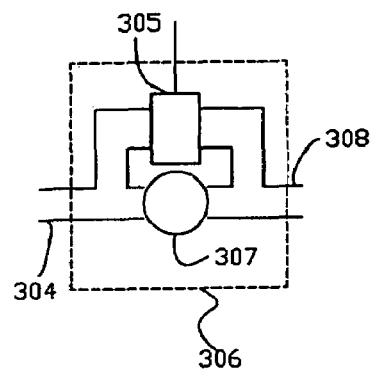
FIG. 6 shows an embodiment of a reduction valve unit of the purge gas subsystem of FIG. 5.

FIG. 6 shows an embodiment of the reduction valve unit 306. The reduction valve unit 306 includes a reduction valve 307 and a controllable on/off valve 305 in parallel between its input 304 and output 308. The control unit 38 opens the controllable on/off valve 305 to permit an increased flow of purge gas in the start-up state 46. In the other states, including the normal state 40, the control unit 38 keeps the controllable on/off valve 305 closed, to block the increased flow.

In an example, the increased flow rate in start-up is twice the flow rate of the normal state 40. It will be realized that other flow rates, for example, in a range between 1.5 and 100 times the normal flow rate may be used. Also, it should be realized that an increased flow may be realized in many ways, for example, by providing entirely separate flow channels from the conditioning unit 301 to the chambers 36a-d, which inject flow at those locations where it is most effective to remove deposited substances. In this case, the control unit 38 opens the separate flow channels in the start-up mode only. Similarly, other embodiments may share a greater or lesser part of the normal flow circuit.

The control unit 38 switches from the start-up state 46 to the pre-normal state 44 once unwanted substances have evaporated or sublimated from the optical components in the beam path. As in the case of switching from the pre-normal state 44, sensor results may be used to detect this from the outflow, or a timer may be used.

Although a specific embodiment has been disclosed, it will be appreciated that other embodiments are possible. For example, various different connection schemes may be used for the purge gas supply, with greater or smaller numbers of valves. In one example only one controllable valve is used for all chambers or a group of chambers to reduce the flow rate from that of the normal state 40 to that of the maintenance state 42. Furthermore, it should be realized that, although the chambers 36a-d preferably enclose each optical components entirely, part or whole of the wall of the chambers 36a-d may be formed by the optical components, as long as the beam path is contained in the chambers 36a-d.

While specific embodiments of the invention have been described above, it will be appreciated that the invention may be practiced otherwise than as described. The description is not intended to limit the invention.

What is claimed is:

1. A lithographic projection apparatus comprising:
   a beam path for a beam of radiation, the beam path comprising a radiation system for providing the beam of radiation, a projection system, a support structure for supporting a patterning device and a substrate holder for holding a substrate, the projection system projecting the beam of radiation patterned by the patterning device onto a target portion on the substrate;
   a chamber that comprises at least part of the beam path and in which at least part of the radiation system, the projection system, the support structure, the substrate holder, or any combination thereof, is exposed to an atmosphere in said chamber;
   a purge gas supply subsystem coupled to said chamber for supplying a flow of purge gas to said chamber, the purge gas supply subsystem comprising a valve; and
   a control unit coupled to the radiation system and the purge gas supply subsystem, and constructed and arranged to switch the purge gas supply subsystem between at least two different modes of operation, the control unit being configured to control the valve of the purge gas supply subsystem to supply mutually different respective non-zero flow rates of the purge gas to the chamber and to control operation of the radiation system in the different modes of operation.

2. A lithographic projection apparatus according to claim 1, wherein the control unit is configured to 1) enable operation of the radiation system, as well as control the valve of the purge gas supply subsystem to supply the purge gas at a normal flow rate sufficient to reduce a concentration of unwanted substances present in the atmosphere in the beam path optically affecting the beam 2) control the valve of the purge gas supply subsystem to supply the purge gas at a further rate smaller than the normal flow rate as well as disable operation of the radiation system.

3. A lithographic projection apparatus according to claim 1, wherein the purge gas supply subsystem further comprises a bypass coupled between an inlet of the valve and an outlet of the valve, the control unit being constructed and arranged to keep the valve open or closed in the different modes of operation.

4. A lithographic projection apparatus according to claim 2, wherein the control unit is further configured to 3) control the valve of the purge gas supply subsystem to supply the purge gas at the normal flow rate as well as disable operation of the radiation system.

5. A lithographic projection apparatus according to claim 4, wherein the purge gas supply subsystem comprises a sensor for detecting concentration of an unwanted substance in gas flowing out of the chamber and/or in gas in the chamber itself, the control unit being coupled to receive a sensor signal from the sensor to defer switching from one mode to another mode until the sensor signal indicates that the concentration has dropped below a predetermined level.

6. A lithographic projection apparatus according to claim 5, wherein the sensor includes a humidity sensor, an oxygen sensor, a total organic content sensor, a sulphur sensor, a silicon sensor, a sensor for phosphorous containing substances and/or a sensor for any other contaminating substances.

7. A lithographic projection apparatus according to claim 2, wherein the beam path comprises a plurality of chambers, the control unit being arranged to switch the purge gas supply subsystem to apply the further flow rate to selectable ones of the chambers, while applying the normal flow rate to a remainder of the chambers.

8. A lithographic projection apparatus according to claim 1, wherein
   the control unit is configured to 1) control the valve of the purge gas supply subsystem to supply the purge gas at a normal flow rate sufficient to reduce a concentration of unwanted substances present in the atmosphere in the beam path optically affecting the beam, as well as enable operation of the radiation system 2) control the valve of the purge gas supply subsystem to supply the purge gas at a further flow rate higher than the normal flow rate, as well as disable operation of the radiation system.

9. A lithographic projection apparatus according to claim 1, wherein the purge gas supply subsystem comprises an emergency bypass, coupled between a purge gas supply connection and the chamber, with an emergency valve in the emergency bypass arranged to supply the purge gas to the chamber in case of a failure of a normal purge gas supply.

10. A lithographic projection apparatus comprising:
a beam path for a beam of radiation, the beam path comprising a radiation system for providing the beam of radiation, a projection system, a support structure for supporting a patterning device and a substrate holder for holding a substrate, the projection system projecting the beam of radiation patterned by the patterning device onto a target portion on the substrate;
a chamber that comprises at least part of the beam path and in which at least part of the radiation system, the projection system, support structure, the substrate holder, or any combination thereof, is exposed to an atmosphere in said chamber; and
a purge gas supply subsystem coupled to said chamber for supplying a flow of purge gas to said chamber;
wherein the purge gas supply subsystem comprises a supply valve and an emergency bypass, coupled between an inlet of the supply valve and an outlet of the supply valve, with an emergency valve in the emergency bypass, arranged to supply the purge gas to the chamber in the case of a failure of a normal purge gas supply.

11. A device manufacturing method comprising:
projecting a patterned beam of radiation onto a target portion on a substrate through a beam path;
applying a purge gas flow to a chamber than contains at least part of the beam path at a normal flow rate to purge an unwanted substance from an atmosphere in the beam path while the beam is passed through the beam path;
switching from the normal flow rate to a further flow rate when the chamber has to be opened for access, the further flow rate being lower than the normal flow rate and sufficiently greater than zero so that condensation of the unwanted substance onto an optical element in the beam path is substantially prevented by the flow of purge gas at the further flow rate.

12. A device manufacturing method according to claim 11, further comprising applying a purge gas at a start-up flow rate, greater than said normal flow rate, prior to switching back to said normal flow rate and passing the beam through the beam path, until condensed unwanted substance has been substantially removed from the optical element.

13. A device manufactured according to the method of claim 11.

14. A lithographic projection apparatus, comprising:
a radiation system for providing a beam of radiation;
a support structure for supporting a patterning device, the patterning device serving to pattern the beam of radiation according to a desired pattern;
a substrate holder for holding a substrate;
a projection system for projecting the patterned beam of radiation on a target portion of the substrate;
a chamber that is capable of carrying a purge gas and through which the beam of radiation travels;
a purge gas supply system coupled to the chamber for supplying a flow of the purge gas to the chamber, the purge gas supply subsystem comprising a valve, wherein at least one of the radiation system, the support structure, the substrate holder, or the projection system is at least partially exposed to the purge gas in the chamber; and
a control unit coupled to the radiation system and the purge gas supply system, and constructed and arranged to switch the purge gas supply system between at least two different modes of operation, the control unit being configured to control the purge gas supply system to supply mutually different respective non-zero flow rates of the purge gas to the chamber and to control operation of the radiation system in the different modes of operation.

15. A lithographic projection apparatus, comprising:
a radiation system for providing a beam of radiation;
a support structure for supporting a patterning device, the patterning device serving to pattern the beam of radiation according to a desired pattern;
a substrate holder for holding a substrate;
a projection system for projecting the patterned beam of radiation on a target portion of the substrate;
a chamber that is capable of carrying a purge gas and through which the beam of radiation travels; and
a purge gas supply subsystem coupled to the chamber for supplying a flow of the purge gas to the chamber, wherein at least one of the radiation system, the support structure, the substrate holder, or the projection system is at least partially exposed to the purge gas in the chamber;
wherein the purge gas supply subsystem comprises a supply valve and an emergency bypass, coupled between an inlet of the supply valve and an outlet of the supply valve, the emergency bypass having an emergency valve and being arranged to supply the purge gas to the chamber in case of a failure of a normal purge gas supply.

16. A lithographic projection apparatus according to claim 1, wherein the valve comprises a controllable variable opening, and wherein the control unit is configured to control the opening of the valve to change the flow rate of the purge gas.

17. A device manufacturing method according to claim 12, further comprising sensing a concentration of the unwanted substance in an outflow from and/or in the chamber, and switching back to said normal flow rate and passing the beam through the beam path when the concentration of the unwanted substance is below a predetermined threshold.

* * * * *